(12) United States Patent
Yamaguchi (10) Patent No.: US 9,370,130 B2
(45) Date of Patent: Jun. 14, 2016

(54) CASING FOR ELECTRONIC EQUIPMENT AND IMAGE FORMING APPARATUS

(75) Inventor: Yoshimasu Yamaguchi, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 282 days.

(21) Appl. No.: 13/469,239

(22) Filed: May 11, 2012

(65) Prior Publication Data

US 2012/0293929 A1 Nov. 22, 2012

(30) Foreign Application Priority Data

May 20, 2011 (JP) ................................. 2011-113266

(51) Int. Cl.
*H05K 9/00* (2006.01)
*H05K 5/00* (2006.01)

(52) U.S. Cl.
CPC .................................... *H05K 9/0009* (2013.01)

(58) Field of Classification Search
CPC .................................................... H05K 9/0009
USPC ................................ 361/679.01; 174/377, 50
See application file for complete search history.

(56) References Cited

U.S. PATENT DOCUMENTS

| | | | | |
|---|---|---|---|---|
| 5,353,201 A | * | 10/1994 | Maeda | 361/816 |
| 6,951,979 B2 | | 10/2005 | Omura et al. | |
| 7,009,109 B1 | * | 3/2006 | Omura et al. | 174/50 |
| 7,113,410 B2 | * | 9/2006 | Pawlenko et al. | 361/818 |
| 7,132,609 B2 | * | 11/2006 | Soule et al. | 174/369 |
| 7,609,996 B2 | | 10/2009 | Yamaguchi | |
| 8,303,051 B2 | * | 11/2012 | Chen | 312/223.2 |
| 2004/0057198 A1 | * | 3/2004 | Kahl et al. | 361/683 |
| 2011/0188185 A1 | * | 8/2011 | Bopp | 361/679.01 |
| 2011/0235303 A1 | * | 9/2011 | Clifton et al. | 361/814 |

FOREIGN PATENT DOCUMENTS

| | | |
|---|---|---|
| CN | 1602152 A | 3/2005 |
| CN | 101178555 A | 5/2008 |
| JP | 6-291485 A | 10/1994 |
| JP | 2002-237915 A | 8/2002 |
| JP | 2005-101172 A | 4/2005 |

OTHER PUBLICATIONS

Chinese Office Action issued in Chinese Application No. 201210156172.9, dated Nov. 19, 2014.

* cited by examiner

*Primary Examiner* — William H Mayo, III
*Assistant Examiner* — Hiram E Gonzalez
(74) *Attorney, Agent, or Firm* — Fitzpatrick, Cella, Harper & Scinto (57) ABSTRACT

A casing for containing electronic equipment includes a casing member of the metal plate having an opening; a closing member for closing the opening; a first inclined plate portion provided at an edge of the opening, the first inclined plate portion being inclined relative to a plate portion of the casing member and being provided by bending the casing member; a second inclined plate portion provided at a edge of the closing member, the second inclined plate portion being provided by bending the closing member, and the second inclined plate portion being opposed to the first inclined plate portion when the closing member is mounted to close the opening; and an elastic member having an electroconductivity and provided compressed between the first inclined plate portion and the second inclined plate portion.

7 Claims, 13 Drawing Sheets

CASING FOR ELECTRONIC EQUIPMENT AND IMAGE FORMING APPARATUS

FIELD OF THE INVENTION AND RELATED ART

The present invention relates to a casing for electronic equipment producing electromagnetic radiation (waves), and an image forming apparatus having such a casing.

For the purpose of speed-up and image quality enhancement in the image forming apparatus (copying machine, printer, facsimile machine, complex machine thereof, for example), a controller with the high frequency clock is required for image processing. A controller substrate or the like generating such clock may produce intense electromagnetic radiation. For example, in digital copying machine, high speed original document scanning and image formation are carried out simultaneously, and therefore, signal systems synchronizing the clock signals overlaps, and/or higher harmonic waves are produced, which lead to the production of more intense electromagnetic radiation. In addition, in a recently color copying machine and/or printer, the super imposition of the CCD control clocks for at least cyan, magenta, yellow and black colors, the speed-up, and the image quality enhancement (high density pixels) result in intense electromagnetic radiation of high frequency bands.

As described in the foregoing, in the recent image forming apparatus, the process speed-up and/or the colorization causes the generation of the electromagnetic radiation. The electromagnetic radiation produced by the device may influence other circuits and/or other outside electronic equipment or the like, it is desirable that leakage of the electromagnetic radiation is suppressed. Therefore, a countermeasure against the intense electromagnetic radiation noise resulting from radiation leakage from such an image forming apparatus is desired.

For example, Voluntary Control Council for Interference by Information Technology Equipment (VCCI) investigates electromagnetic radiation shielding countermeasures against the electromagnetic radiation leakage in the band of 30-230 MHz. It is desirable that such countermeasures are inexpensive while maintaining sufficient electromagnetic radiation shielding effect, from the standpoint of the recent low cost demand.

For example, Japanese Laid-open Patent Application 2005-101172 discloses a structure in which a mounting peripheral portion is formed by bending at a peripheral portion of an opening shield portion (closing member) covering an opening of a casing such that an angle forming between the opening shield portion is an obtuse angle, and the mounting peripheral portion is press-fitted into the opening. With the structure disclosed in Japanese Laid-open Patent Application 2005-101172, what is required is simply to press-fit the bent mounting peripheral portion into the opening, and therefore, the manufacturing and mounting thereof are easy, and the cost is low.

However, with this structure, the electromagnetic radiation shielding effect may not be sufficient. There is a possibility that a gap occurs at the contact portion between the mounting peripheral portion and the opening, and if this occurs, the electromagnetic radiation may leak. More particularly, the mounting peripheral portion of the opening shield portion is press-fitted directly into the opening of the casing, and therefore, selection of the dimensional tolerances is difficult.

In addition, when the mounting peripheral portion is press-fitted into the opening of the casing, a gap is produced in the contact portion at each side of the opening in the longitudinally central portion. This is because the contact pressure is high below the opposite longitudinal end portions of the contact portion, but in the central portion of the contact portion, a gap is produced by a reaction force. As a result, a semicircle space which permits the electromagnetic radiation to pass is formed in the central portion of the contact portion, and therefore, the electromagnetic radiation leakage prevention is not sufficient.

Furthermore, when the material of the casing and/or the opening shield portion is zinc-plated steel plate, the contact pressure may not be uniform due to the influence of the surface roughness of the material, and the points of contact may be dispersed. And, the electric resistance by an oxide coating on the zinc surface may result in conduction defect. For these reasons, it is possible that the electromagnetic radiation leakage prevention is not sufficient.

According to an aspect of the present invention, there is provided a casing and an apparatus with which the occurrence of the gap in the contact portion between the opening of the casing and the closing member therefor, and the conduction at the contact portion is assured, thereby sufficiently suppressing leakage an electromagnetic radiation noise.

SUMMARY OF THE INVENTION

According to an aspect of the present invention, there is provided a casing for containing electronic equipment producing electromagnetic radiation, said comprising a casing member of the metal plate having an opening; a closing member for closing said opening; a first inclined plate portion provided at an edge of said opening, said first inclined plate portion being inclined relative to a plate portion of said casing member and being provided by bending said casing member; a second inclined plate portion provided at a edge of said closing member, said second inclined plate portion being provided by bending said closing member, and said second inclined plate portion being opposed to said first inclined plate portion when said closing member is mounted to close said opening; and an elastic member having an electroconductivity and provided compressed between said first inclined plate portion and said second inclined plate portion.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

<First Embodiment>

Figure 1:
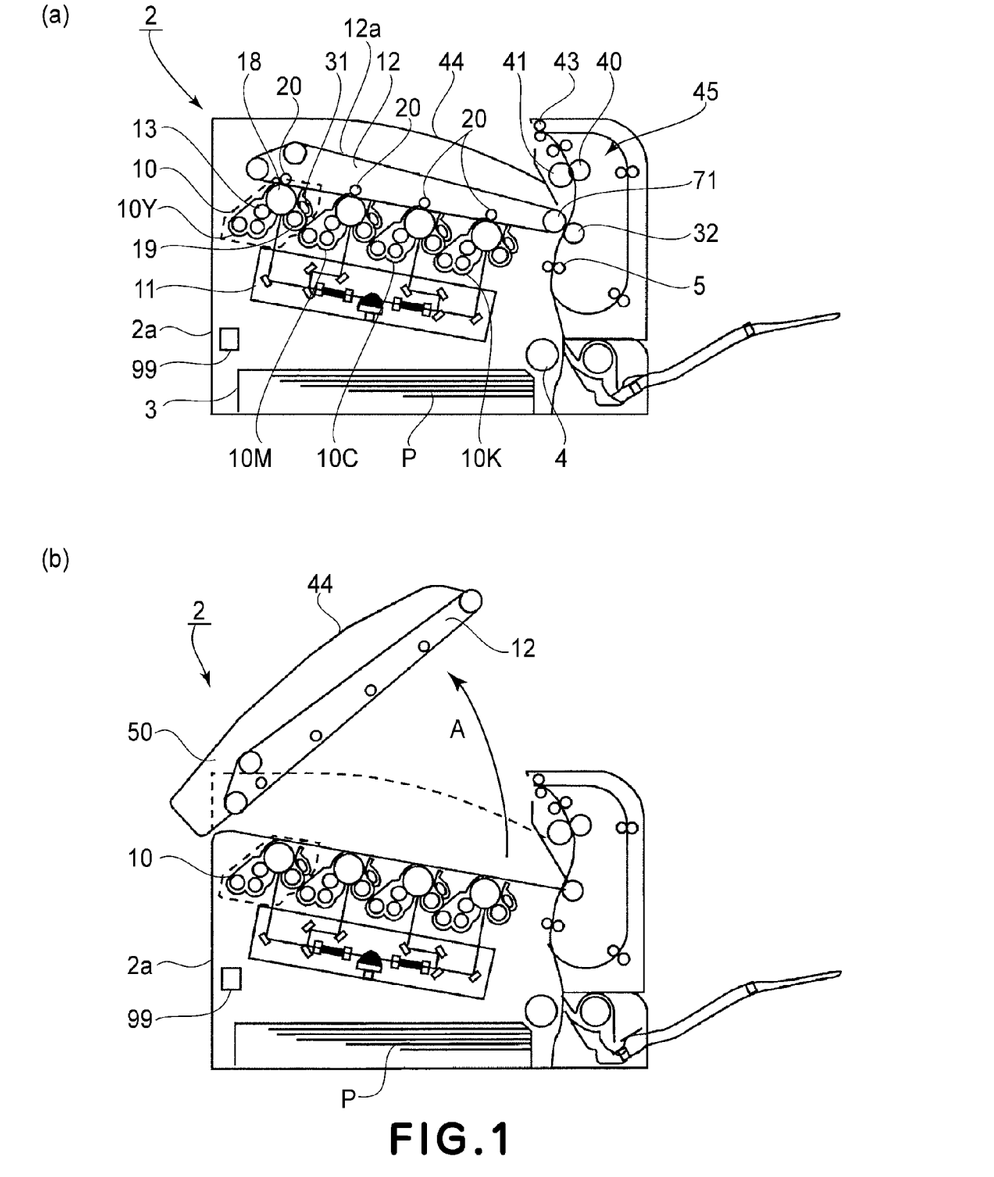
FIG. 1 shows a substantial structure of an image forming apparatus according to a first embodiment of the present invention.

Referring to FIG. 1 to FIG. 9, a first embodiment will be described. The preferred embodiments of the present invention will be described in conjunction with the accompanying drawings. Here, the dimensions, the sizes, the materials, the configurations, the relative positional relationships of the elements in the following embodiments and examples are not restrictive to the present invention unless otherwise stated. Referring to FIG. 1, a substantial structure of an image forming apparatus provided with a casing for electronic equipment will be described.

[Image Forming Apparatus]

FIG. 1 is an image forming apparatus 2 as an electrophotographic type full color printer. As shown in part (a) of FIG. 1, the image forming apparatus 2 comprises process cartridges 10 which are image forming stations arranged in a substantially horizontal line at predetermined intervals. The process cartridge 10 includes a process cartridge 10Y for yellow, a process cartridge 10M for magenta, a process cartridge 10C for cyan, a process cartridge 10K for black. The process cartridges 10Y, 10M, 10C, 10K have similar structures, and therefore, the common descriptions are simplified by omitting the suffixes (Y, M, C and K).

Each process cartridge 10 is detachably mountable to a main assembly 2a of the apparatus. The process cartridges 10 are provided along an intermediary transfer belt 12a inside the apparatus main assembly 2a. Process cartridges 10 comprises a drum type electrophotographic photosensitive member (photosensitive drum) 18 which is an image bearing member, at a center portion. The photosensitive drums 18 are contacted to the intermediary transfer belt 12a. Around each photosensitive drum 18, there are provided a primary charger 19 as primary charging means, a developing roller 13 as developing means, and a drum cleaner device 31 as cleaning means.

The primary charger 19 charges uniformly a surface of the photosensitive drum 18 to a negative predetermined potential by a charging bias voltage applied from a charging bias voltage source (unshown). The developing roller 13 feeds a developer and deposits the developer on each electrostatic latent image formed on the photosensitive drum 18 by an exposure device 11, thereby to develop (visualize) it into a developed image. The drum cleaner device 31 includes a cleaning blade or the like for removing, from the photosensitive drum 18, an untransferred residual developer remaining on the photosensitive drum 18 after a primary transfer operation.

At a position opposed to the photosensitive drum 18, there is provided a transfer roller 20 as primary transferring means, and the exposure device 11 is provided below between the primary charger 19 and the developing roller 13. The transfer roller 20 is disposed in a transfer belt unit 12 including the intermediary transfer belt 12a as in-line type intermediary transferring means, and is urged toward the photosensitive drum 18. The exposure device 11 comprises laser beam emitting means for emitting a beam modulated in accordance with time series electrical digital pixel signals, a polygonal mirror, lenses, a reflection mirror and so on. By effecting the exposure of the photosensitive drum 18, an electrostatic latent image is formed in accordance with the image information on the surface of the photosensitive drum 18 charged by the primary charger 19.

The transfer belt unit 12 is provided with a driving roller 71 functioning also as a secondary transfer opposing roller, and the driving roller 71 is disposed opposed to a secondary transfer roller 32. Downstream of the secondary transfer roller 32 with respect to a feeding direction of a sheet P, there is provided a fixing device 45 including a fixing roller 41 and a pressing roller 40 in the form of a longitudinal path.

The sheet P set in a feeding cassette 3 is singled out by a feeding roller 4, and is fed to a nip between the secondary transfer roller 32 and the driving roller 71 by a pair of registration rollers to receive the developed image. The fixing device 45 fixes the image, and the sheet P is discharged to a discharging tray 44 by discharging rollers 43.

The lifetimes of the process cartridge 10 and the transfer belt unit 12 are relatively short, and therefore, have to be replaced in order to use the image forming apparatus 2 to the end of the lifetime. In view of this, in order to facilitate replacements of the process cartridge 10 and the transfer belt unit 12, a unit (upper door unit 50) including the discharging tray 44 and the transfer belt unit 12 is opened and closed relative to the apparatus main assembly 2a.

With such a structure, as shown in part (b) of FIG. 1, the upper door unit 50 is opened upwardly of an apparatus main assembly 2a (direction of arrow A) by which the process cartridge 10 and the transfer belt unit 12 can be made detachable, facilitating the maintenance. Thus, the process cartridge 10 is demounted from the apparatus main assembly 2a in a direction perpendicular to an axis of the photosensitive drum 18.

Figure 2:
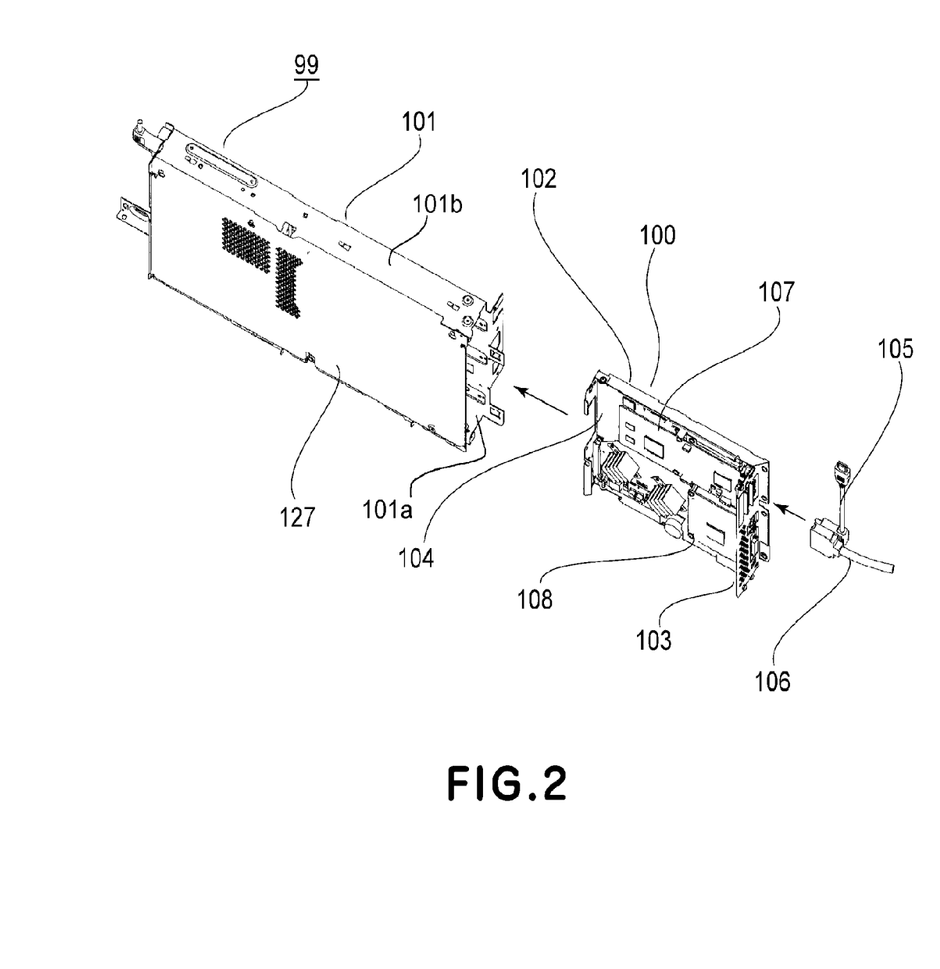
FIG. 2 is an exploded perspective view of a controller for the image forming apparatus.
Figure 3:
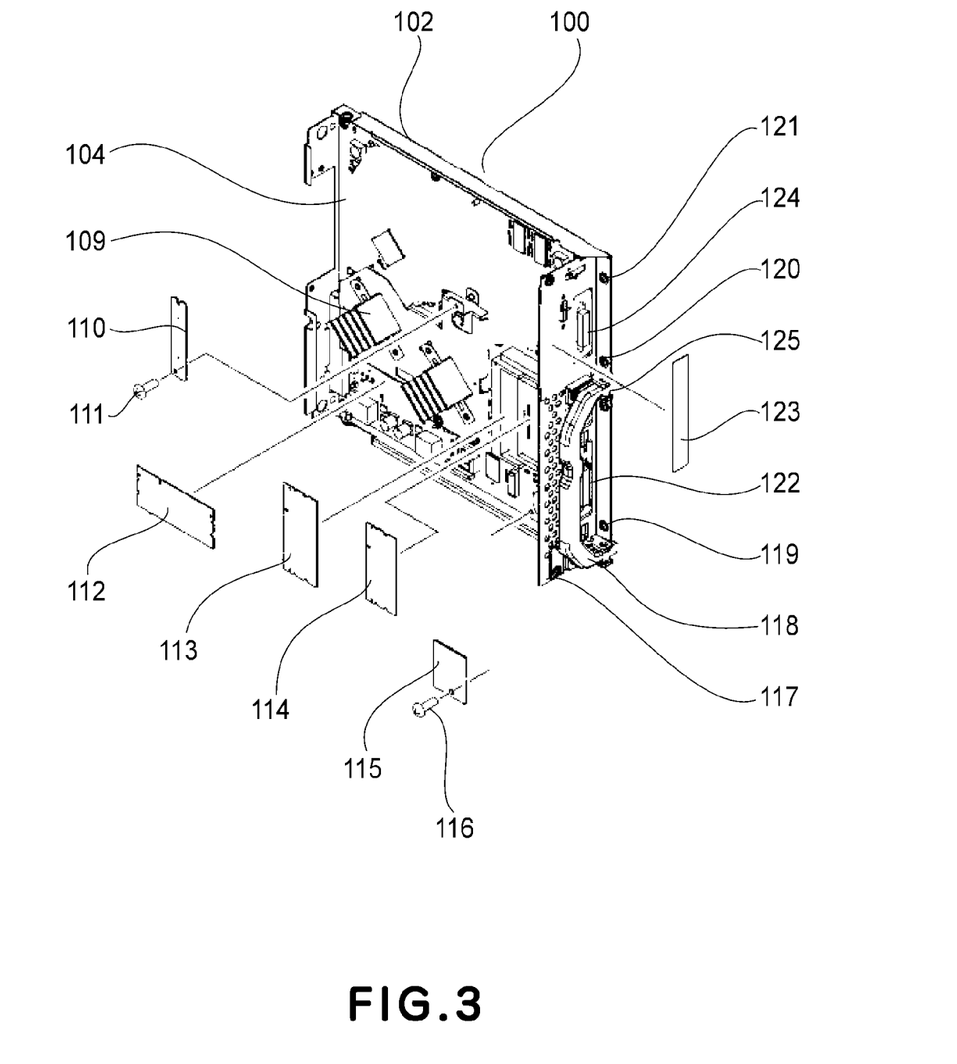
FIG. 3 is an exploded perspective view of accessories mounted on a controller unit.

Such an image forming apparatus 2 is controlled by a controller 99. The position of the controller 99 is not limited to the illustrated example. Such a controller 99 is connected with various sensors in an apparatus main assembly 2a and with extending from personal computer or the like. The controller 99 is also connected with voltage sources and/or motors, and controls the voltage sources and the motors on the basis of instructions from the sensors and/or outer terminals. Referring to FIGS. 2 and 3, the controller 99 will be described.

[Controller]

As shown in FIG. 2, controller 99 comprises a controller casing 101 and a controller unit 100 including the electronic equipment for effecting above-described control. The controller casing 101 is a metal plate of SPCC nickel-plated steel plate or zinc-plated steel plate punched and/or bent into a substantially rectangular parallelepiped configuration, and is provided with a rectangular opening 101a at one longitudinal end. In the case of this embodiment, the controller casing 101 comprises a casing lid (closing member) 127 which is a plate portion constituting one side of the substantially rectangular parallelepiped configuration, and the other portion (main body 101b of the casing). The casing lid 127 is screw fastened to the main body 101b. Thus, the casing lid 127 is detachably mountable to the main body 101b of the casing.

As indicated by an arrow in FIG. 2, into the opening 101a of the controller casing 101, the controller unit 100 is inserted, and the controller unit 100 is fixed to the controller casing 101 by screws or the like. Furthermore, when a HDMI (High-Definition Multimedia Interface) cable 105, a data communication cable 106 or another cable are mounted and connected, the control and the electronic information transmission with the external equipment is possible.

To the controller unit 100, a parent substrate 104 is mounted to a supporting table 102, and the top surface thereof is provided with a first child substrate 107 and a second child substrate 108. A connector for connection with the outside is provided on a supporting surface 103 of an interface supporting plate 117, is connected with the outside HDMI cable 105 and the data communication cable 106 by insertion in the direction indicated by the arrow. In the case that a first child substrate 107 and/or second child substrate 108 as an option is added in addition to the parent substrate 104, the controller unit 100 can be drawn out of the controller casing 101.

FIG. 3 shows accessories (electronic equipment) provided in the controller unit 100, and the parent substrate 104 is screwed on the supporting table 102. A digital processor, a standard interface driver and various electronic parts (electronic equipment) operable therewith are provided. Furthermore, a heat sink 109 is provided to cool parts which generate heat.

The accessory substrate holds a memory cards such as a first DIMM (Dual Inline Memory Module) 112, second DIMM 113, a third DIMM 114. In addition, a SRAM (Static Random Access Memory) substrate 115 is also fixed by a screw 116. An optional closed terminal child substrate 110 is mounted by a screw 111. The interface supporting plate 117 is mounted on the supporting table 102 by screws 121, 120, 125, 119, and a mounting and demounting grip 118 is rotatably mounted. An outer surface is visible and is may be provided with a label 123 indicating to which the connectors 124, 122 are to be connected.

[Casing for Electronic Equipment]

An electronic equipment casing (casing) 99*a* for containing the controller unit 100 (electronic equipment) will be described. The casing 99*a* comprises the above-described controller casing 101 and the above-described interface supporting plate 117 made of a metal plate such as a SPCC nickel-plated steel plate or a zinc-plated steel plate. As shown in FIG. 2, the interface supporting plate 117 is a closing member mounted to the opening 101*a* shown in FIGS. 4 and 5 in the state that the controller unit 100 is provided in the controller casing 101.

As described hereinbefore, the electronic equipment is provided in the controller unit 100, and the electromagnetic radiation is produced by such electronic equipment. The casing 99*a* for the electronic equipment preferably suppresses leakage of such electromagnetic radiation. Such electromagnetic radiation has a predetermined frequency and a predetermined speed. The electromagnetic radiation leaks when there is a gap larger than a size predetermined in accordance with the wavelength calculated from the frequency and the speed. The supporting plate 117 is provided with a plurality of holes for cooling, and the size of the holes is selected so as to be smaller than the predetermined size, and therefore, no electromagnetic radiation leaks through the holes.

The gaps at the opposite longitudinal end portions of the opening 101*a* is smaller than the predetermined size, and therefore, no electromagnetic radiation leaks through the gaps. On the other hand, if a gap occurs between the side of the interface supporting plate 117 fixed to the supporting table 102 and a peripheral portion (free end portion) at the opposite side, the gap may be larger than the predetermined size determined in accordance with the above-described wavelength. Therefore, it is desired that no gap is formed at this position, in order to prevent the leakage of the electromagnetic radiation. Therefore, it is desired that a gap which is unavoidable due to dimensional tolerances and so on is minimized.

Figure 6:
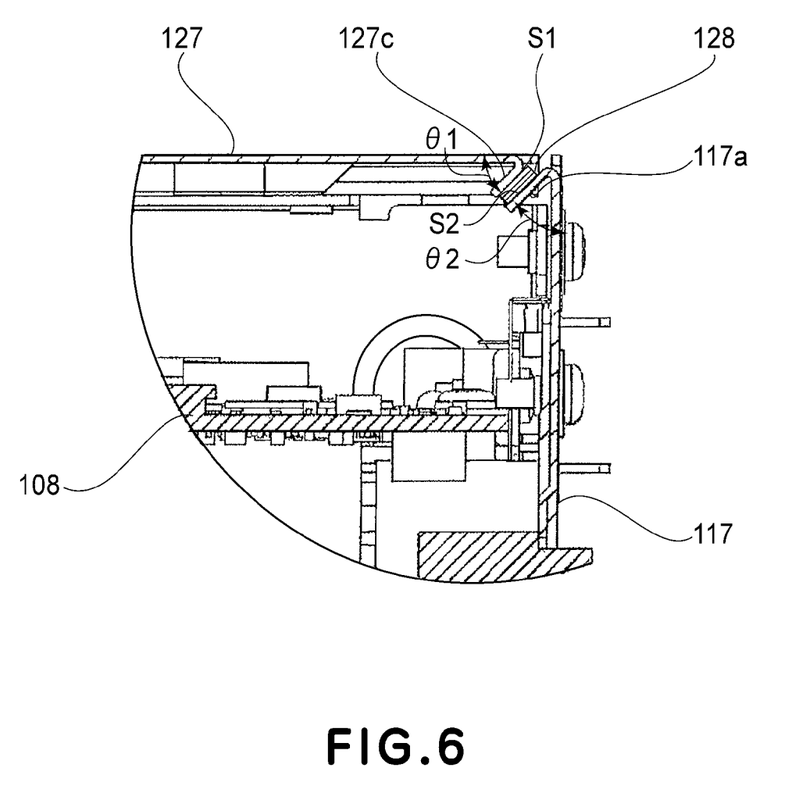
FIG. 6 is a sectional view taken along a line B-B of FIG. 5.

For this reason, in this embodiment, as shown in FIG. 6, at at least one side a peripheral portion of the opening 101*a*, a bent portion 127*c* (first inclined plate portion) is formed by bending such that it is inclined relative to the casing lid 127 which is a plate portion of the casing having said one side. At at least one side of the peripheral portion of the interface supporting plate 117 (closing member), a bent portion 117*a* (second inclined plate portion) is formed by bending. The bent portion 117*a* is opposed to the bent portion 127*c* (first inclined plate portion) in the state that it is mounted to the opening 101*a* of the interface supporting plate 117. Between the bent portion 127*c*, which is the first inclined plate portion, and the bent portion 117*a*, which is the second inclined plate portion, a gasket 128, which is an electroconductive elastic member, is elastically compressed.

In this embodiment, said at least one side of the peripheral portion of the interface supporting plate 117 is a peripheral portion (free end portion) opposite the side to which the supporting table 102 of the interface supporting plate 117 is fixed. And, said at least one side of the peripheral portion of the opening 101*a* is the peripheral portion of the opening 101*a* opposed to the free end portion. The side is mentioned as at least one side, and the bent portions may be provided similarly, at the opposite longitudinal end portions of the opening 101*a*, for example, when the electromagnetic radiation may leak depending on the size and/or the configuration of the opening.

In this embodiment, the bent portion 127*c* is bent inwardly of the casing 99*a* at the edge nearer to the opening 101*a* of the casing lid 127 such that the angle of the bent portion 127*c* relative to the casing lid 127 is a acute angle. The angle θ1 between the casing lid 127 and a first contact surface S1 contacting the gasket 128 of the bent portion 127*c* is an acute angle. Therefore, the first contact surface S1 inclines such as to be outward (the direction toward the peripheral edge of the opening 101*a*) toward the interface supporting plate 117.

The bent portion 117*a* is bent inwardly of the casing 99*a* toward the free end portion of the interface supporting plate 117 such as to form an acute angle relative to the interface supporting plate 117. An angle θ2 formed between the interface supporting plate 117 and a second contact surface S2 contacting the gasket 128 of the bent portion 117*a* is an acute angle. By doing so, the second inclined surface S2 opposes to the first inclined surface S1 of the bent portion 127*c*. By forming the bent portions 127*c*, 117*a* in this manner, the edge of the bent portion 127*c* and the edge of the bent portion 117*a* are inward of the casing 99*a*.

By such bending, the bent portion 127*c* and the bent portion 117*a* are formed inside the peripheral portion of the opening 101*a* and inside the outer surface of the interface supporting plate 117. In other words, the bent portion 127*c* and the bent portion 117*a* do not project beyond a phantom corner portion formed by extending and crossing the outer surface of the casing lid 127 and the outer surface of the interface supporting plate 117.

Such bent portion 127*c* and bent portion 117*a* are bent to such angles that they are substantially parallel with each other in the state that the interface supporting plate 117 is mounted to the opening 101*a*. For example, the angle θ1 formed between the bent portion 127*c* and the casing lid 127 and the angle θ2 formed between the bent portion 117*a* and the interface supporting plate 117 are substantially 45 degrees. The gasket 128 is placed between the entirety of the opposing surfaces (first contact surface S1 and the second contact surface S2) of the bent portion 127*c* and the bent portion 117*a*.

In this embodiment, the gasket 128 is stuck by an electroconductive double coated tape on the second contact surface S2 of the bent portion 117a of the interface supporting plate 117. When the interface supporting plate 117 is mounted to the opening 101a, the gasket 128 is contacted in the state that it is elastically compressed to the first contact surface S1 of the bent portion 127c of the casing lid 127.

The gasket 128 comprises a core material of an elastic member and electroconductive textile covering it. For example, the core material is made of polyurethane foam, and the electroconductive textile constitutes a peripheral skin portion. The electroconductive textile comprises PET (polyethylene terephthalate) resin plated with copper and nickel to provide the electroconductivity. For example, it is an electromagnetic radiation shield gasket available from SEIWA Electric MFG. Co. Ltd., Japan. The gasket has flexibility due to the flexible of the textile and an elasticity of the polyurethane foam resin, and as shown in FIG. 6, it is compressed and accommodated in close-contact between the casing lid 127 and the interface supporting plate 117.

Such a gasket 128 has a substantially rectangular cross-sectional configuration and is substantially rectangular parallelepiped rod member, in a free state. One of the lateral side surfaces of the rod is provided with an electroconductive acrylic resin adhesive material which is the electroconductive double coated tape, and is stuck on the bent portion 117a of the interface supporting plate 117 which is the counterpart metal. By doing so, it is electrically grounded to establish conduction. The gasket 128 may be fixed to the bent portion 127c of the casing lid 127 with the electroconductive double coated tape. This embodiment, the side on which the gasket 128 is fixed is not restrictive.

Figure 4:
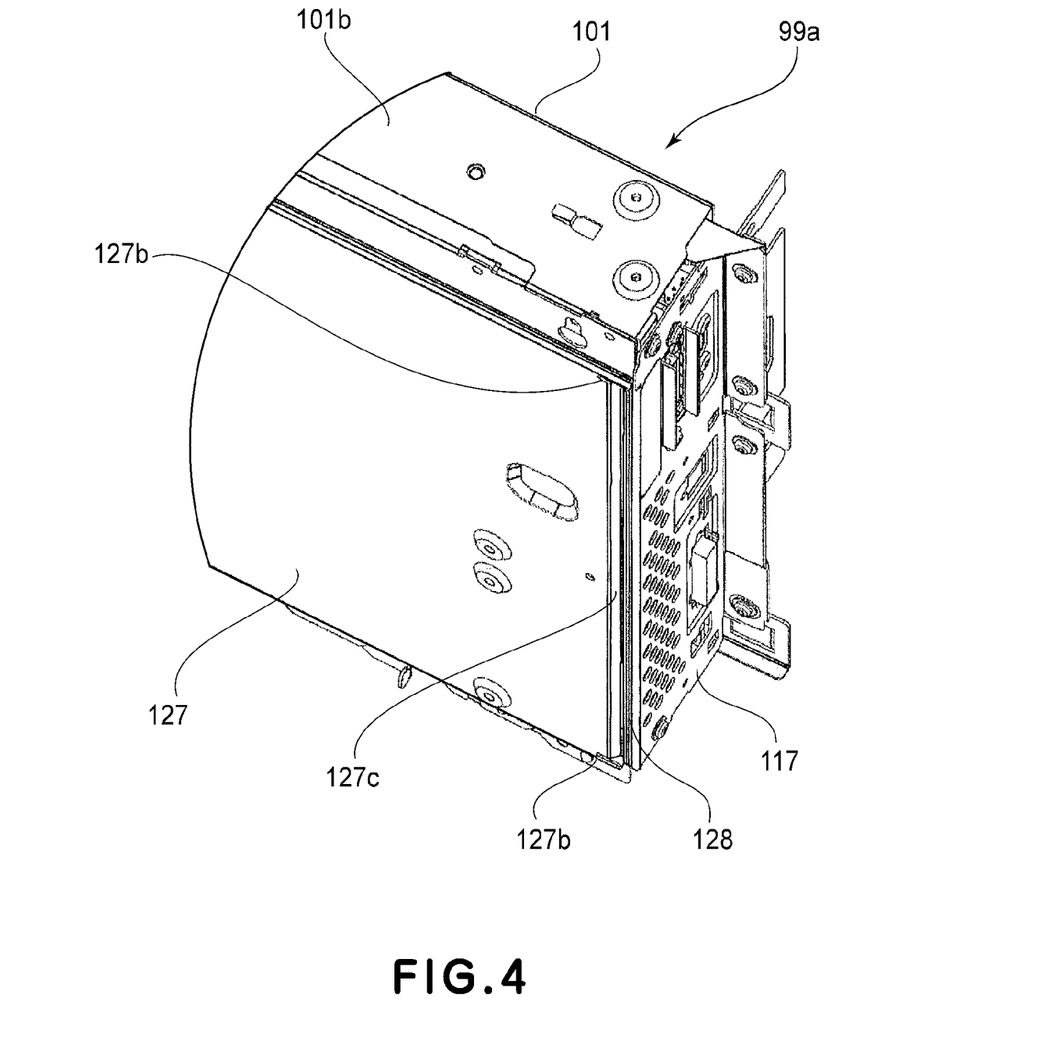
FIG. 4 is a partial perspective view of a contact portion of a casing for a controller according to the first embodiment.
Figure 5:
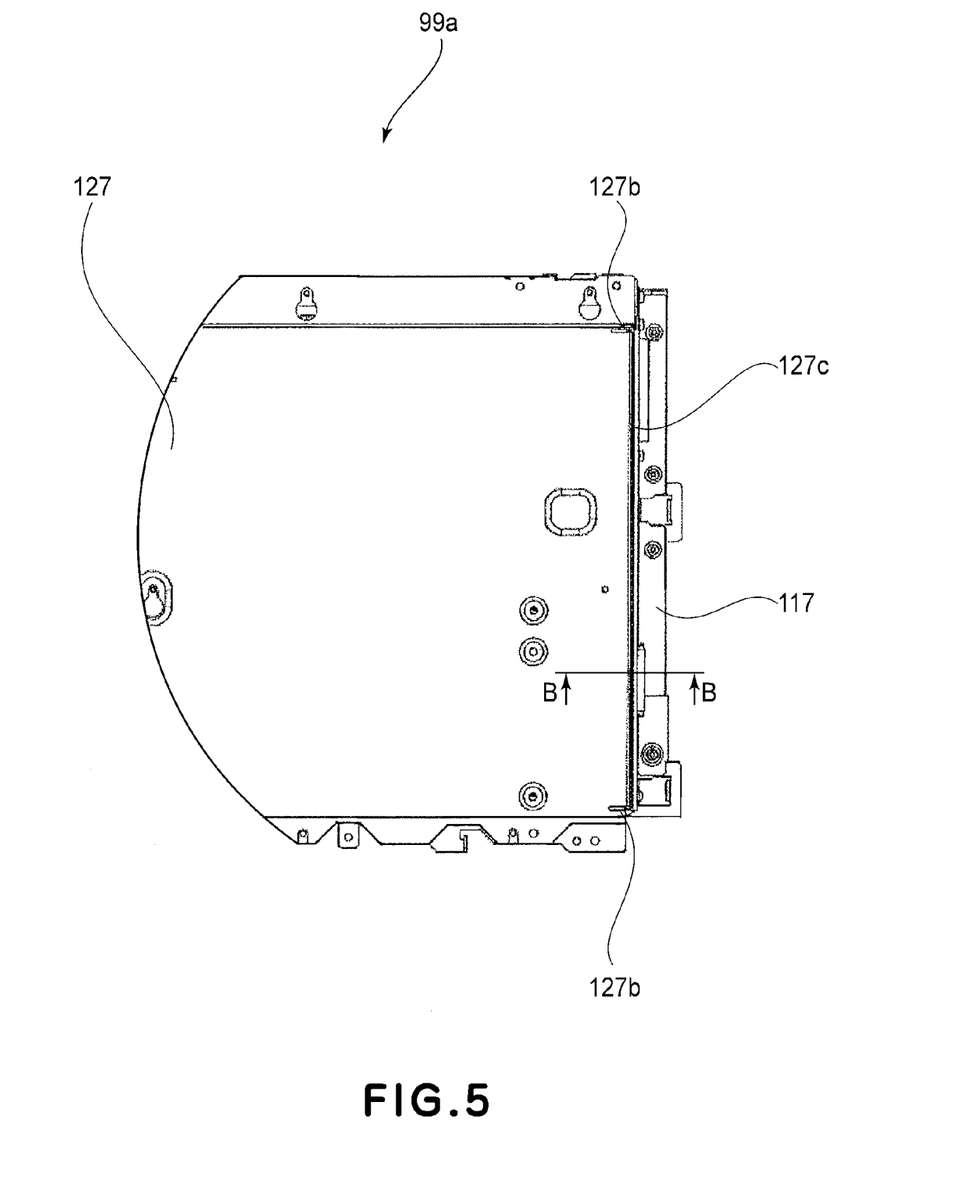
FIG. 5 is a partial top plan view.

In this embodiment, as shown in FIGS. 4 and 5, a slit 127b is provided at each of two positions of an end portion of the casing lid 127. A slit 127b (cut-away portion) is formed between the bent portion 127c and each of the opposite end edges (opposite edges with respect to the widthwise direction) adjacent the bent portion 127c. The opposite edges of the casing lid 127 are fixed to the main body 101b of the casing. By the formation of the slit 127b, a proper degree of flexion is provided so that even if an excessive urging force is applied due to the size variations, the slit 127b can reduce to accommodate the excessive force. Thus, the portion of the lid 127 between the slits 127b is prevented from curving by the reaction force when the interface supporting plate 117 is mounted to the opening 101a. Since the bent portion 127c is provided between the slits 127b, a straightness of the bent portion 127c can be assured.

The bent portion 127c and the bent portion 117a constituting the contact portions between the casing lid 127 and the interface supporting plate 117 are provided by bending the casing lid 127 and the interface supporting plate 117. Therefore, strength in the longitudinal direction perpendicular to the bending direction can be improved.

According to this embodiment, the bent portion 127c and the bent portion 117a constituting the contact portions between the opening 101a of the controller casing 101 and the interface supporting plate 117 are formed by the bending, and therefore, a gap is not easily occurred in the contact portions. That is, the bent portion 127c and the bent portion 117a are not easily deformed, over the entire length, by the reaction force generated at the contact portions when the interface supporting plate 117 is mounted to the opening 101a, and therefore, a gap is not easily formed in the contact portions.

In addition, since the gasket 128 is compressed between the bent portion 127c and the bent portion 117a, no gap occurs between the bent portion 127c and the bent portion 117a. In addition, sufficient electrical conduction can be assured with the prevention of a gap in the contact portions. As a result, the leakage of the electromagnetic radiation noise through the contact portions can be prevented.

In this embodiment, the straightness of the bent portion 127c over the length is assumed by the formation of the slits 127b at the end portions of the bent portion 127c, in addition to the strength enhancement of the bent portions 127c, 117a. Therefore, a gap in the central portion of the contact portion, which results in a conduction defect due to insufficient contact pressure, is substantially avoided due to the reaction force against the gasket 128. Generally, it is known that an oxide film is relatively tougher in the zinc-plated steel plate then in the SPCC nickel-plated steel plate, and therefore, the conduction is relatively difficult in the case of the zinc-plated steel plate. But according to this embodiment, the pressure is supplied so that the contact area can be increased thus assuring the electrical conduction. The slit 127b of the casing lid 127 is significantly effective to maintain the straight state of the bent portion 127c so that the contact area is increased to improve the conductivity.

In addition, since the free end portions of the bent portions 127c, 117a are inward, radiation noise can be prevented from leaking at the free end portions of the bent portions 127c, 117a. Ordinarily, the casing for electric equipment is electrically grounded, but when a printed board and/or electrical components which produces high frequency noise is placed therein, the casing functions as a radiation antenna radiating radiation noise from the edge portion of the metal plates. In this embodiment, the edge portion is bent inwardly so that no edge portion is outside, and therefore, the noise is not radiated from the inside of the casing for the controller. Particularly, the potentials of the bent portions 127c, 117a are substantially the same through the gasket 128, thus further preventing the noise leakage.

In addition, the bent portion 127c and the bent portion 117a are inside the peripheral portion of the opening 101a and inside the interface supporting plate 117. Therefore, the bent portion 127c and/or the 117a does not protrude outwardly, and therefore, do not require additional outside space. In addition, the edge portion of the metal plate does not protrude outward, and therefore, the operator does not touch an edge portion, thus improving operability.

Figure 7:
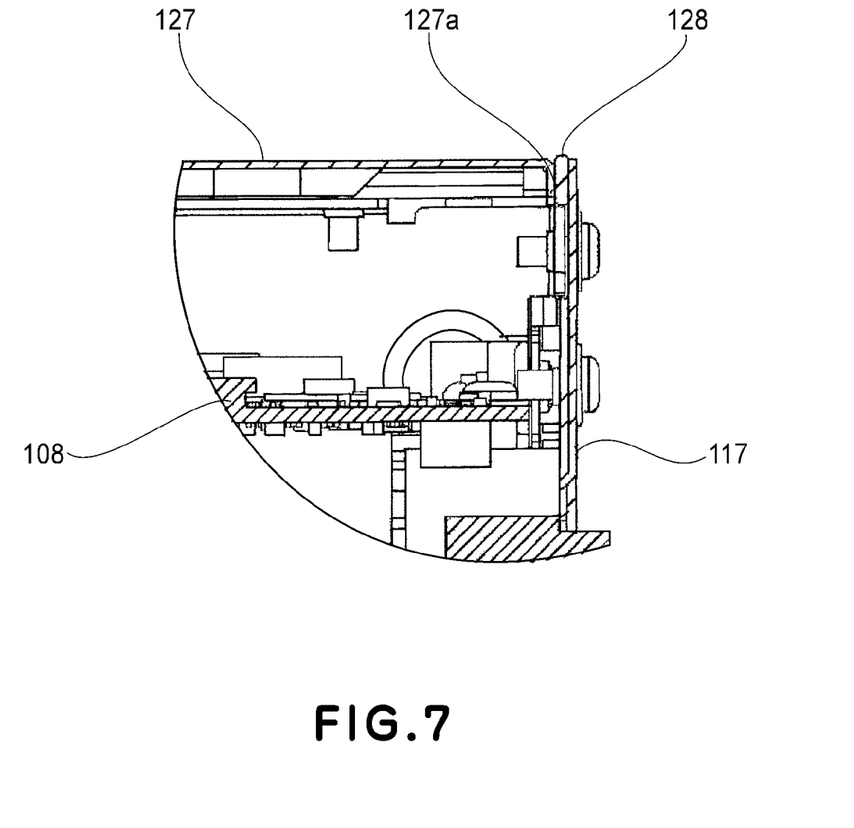
FIG. 7 is a sectional view similar to the FIG. 6 but for a comparison example.
Figure 8:
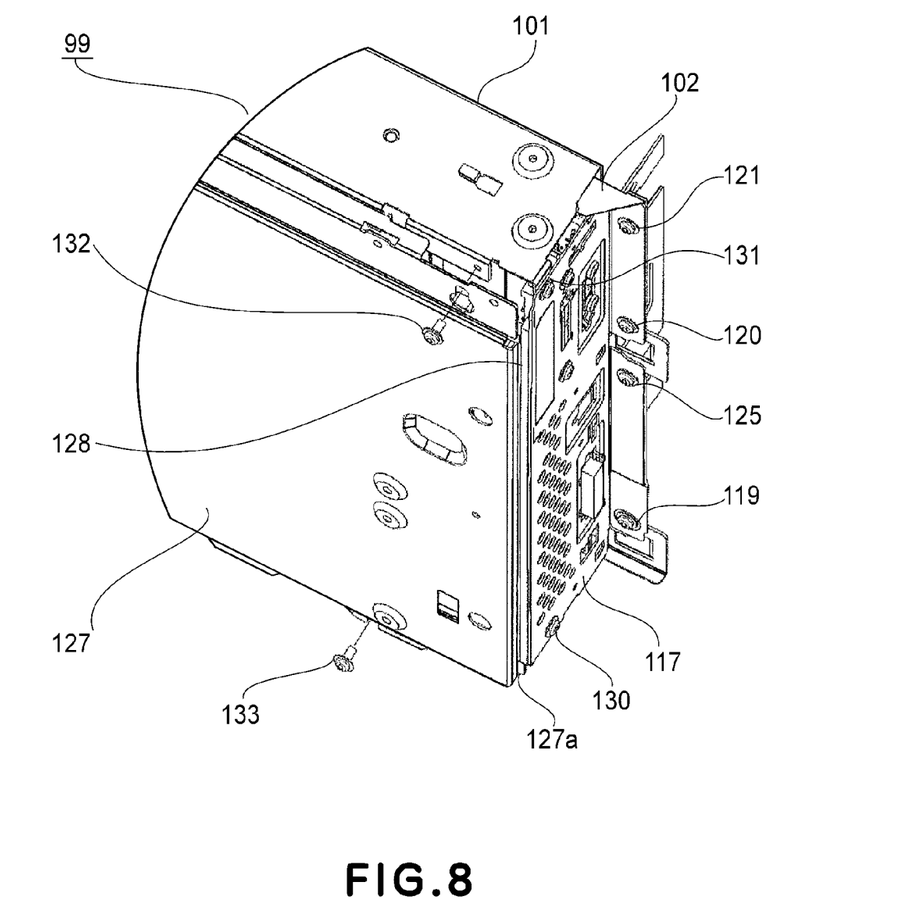
FIG. 8 is a perspective view showing another example of assembled state of the casing.
Figure 9:
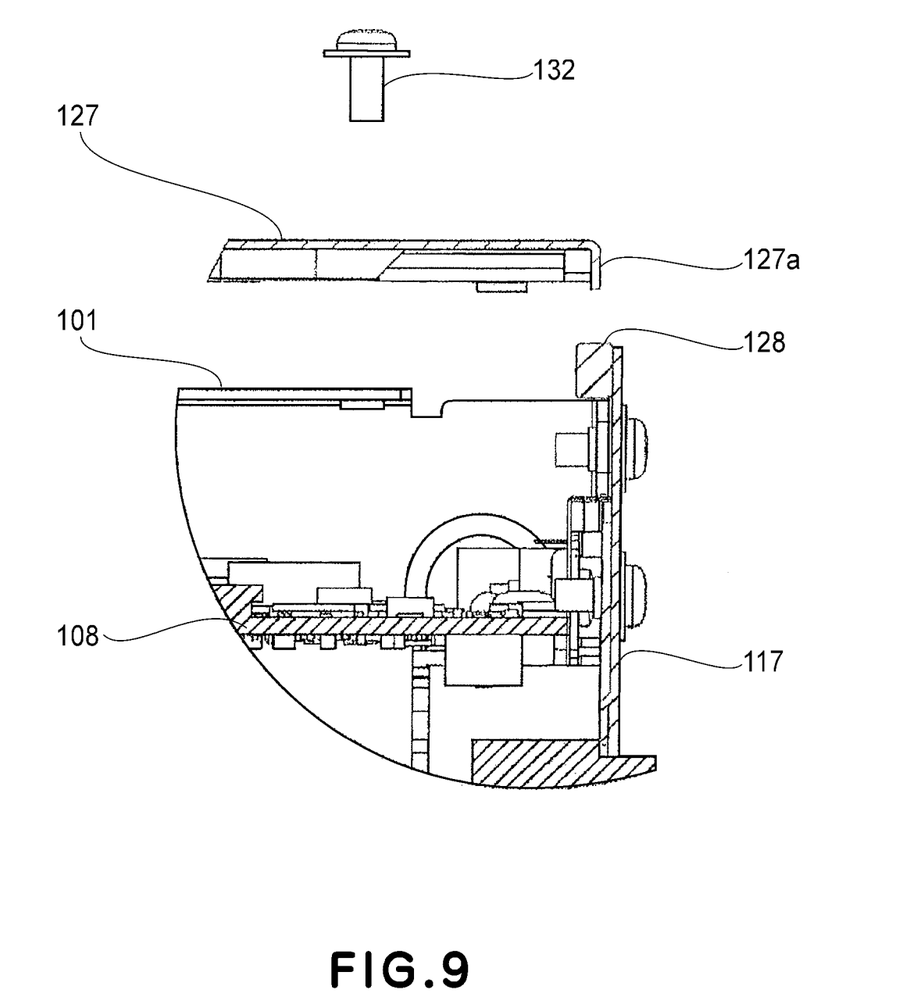
FIG. 9 is a sectional view similar to FIG. 7 but for a comparison example.

Furthermore, in this embodiment, the bent portion 127c, 117a are provided on both of the casing lid 127 and the interface supporting plate 117. And, the angle θ1, formed between the casing lid 127 and the first contact surface S1 of the bent portion 127c, and the angle θ2, formed between the interface supporting plate 117 and the second contact surface S2 of the bent portion 117a, are acute angles. Furthermore, the first contact surface S1 and the second contact surface S2 nip the gasket 128 therebetween. The gasket 128 is prevented from being damaged irrespective of the order of mounting or disassembling of the casing 99a. Referring to FIG. 7 to FIG. 9, this will be described.

Referring to FIG. 7, the description will be made as to a structure with which the gasket 128 is nipped by a free end portion surface the interface supporting plate 117 not having the bent portion and the bent portion 127a provided by bending the free end portion of the casing lid 127 to the right angles. With such a structure, the order of the mounting or disassembling is determined as irrespective of whether the gasket 128 is fixed to the interface supporting plate 117 or to the casing lid 127.

In the mounting, the casing lid 127 is fixed to the main body 101b of the casing by screws 132, 133 or the like, and then the interface supporting plate 117 is fixed by screws 130, 131 or the like. If it is assumed that as shown in FIG. 8, the interface supporting plate 117 is fixed to the main body 101b of the casing, and then the casing lid 127 is fixed. Then, as shown in FIG. 9, the free end portion of the bent portion 127a of the casing lid 127 interferes with the side surface of the gasket 128 fixed to the interface supporting plate 117. Even if the gasket 128 is fixed to the bent portion 127a side, the free end portion of the interface supporting plate 117 interferes with a side surface of the gasket 128 during mounting.

This may result in damage of the gasket 128, separation of the electroconductive double coated tape stuck between the gasket 128 and the bent portion 127a, or the interface with the supporting plate 117.

On the other hand, in disassembling (dismounting), the screws 130, 131 fixing the interface supporting plate 117 are unthreaded, or the screws 130, 131 are removed, and then the casing lid 127 is removed from the main body 101b of the casing. If it is assumed that the casing lid 127 is removed while the interface supporting plate 117 is kept fixed to the main body 101b of the casing, a large shearing force is produced in the gasket 128 with the possible result of the damage to the gasket 128 to such an extent that it is non-reusable.

On the other hand, according to this embodiment, the order of the mounting or disassembling is not limited irrespective of whether the gasket 128 is fixed to the bent portion 117a of the interface supporting plate 117 or to the bent portion 127c of the casing lid. That is, the casing lid 127 may be mounted after the interface supporting plate 117 is fixed to the main body 101b of the casing because the inclined bent portion 127c and bent portion 117a are provided.

In addition, even when the casing lid 127 is removed while the interface supporting plate 117 is kept fixed to the main body 101b of the casing, the shearing force is not easily produced in the gasket 128. Particularly, when the bending angles the substantially 45 degrees as in this embodiment, the force tending to peel the gasket 128 off and the shearing force produced in the gasket 128 upon dismounting can be completely avoided. Therefore, the damage to the gasket 128 can be avoided irrespective of the operational procedures.

<Second Embodiment>

Figure 10:
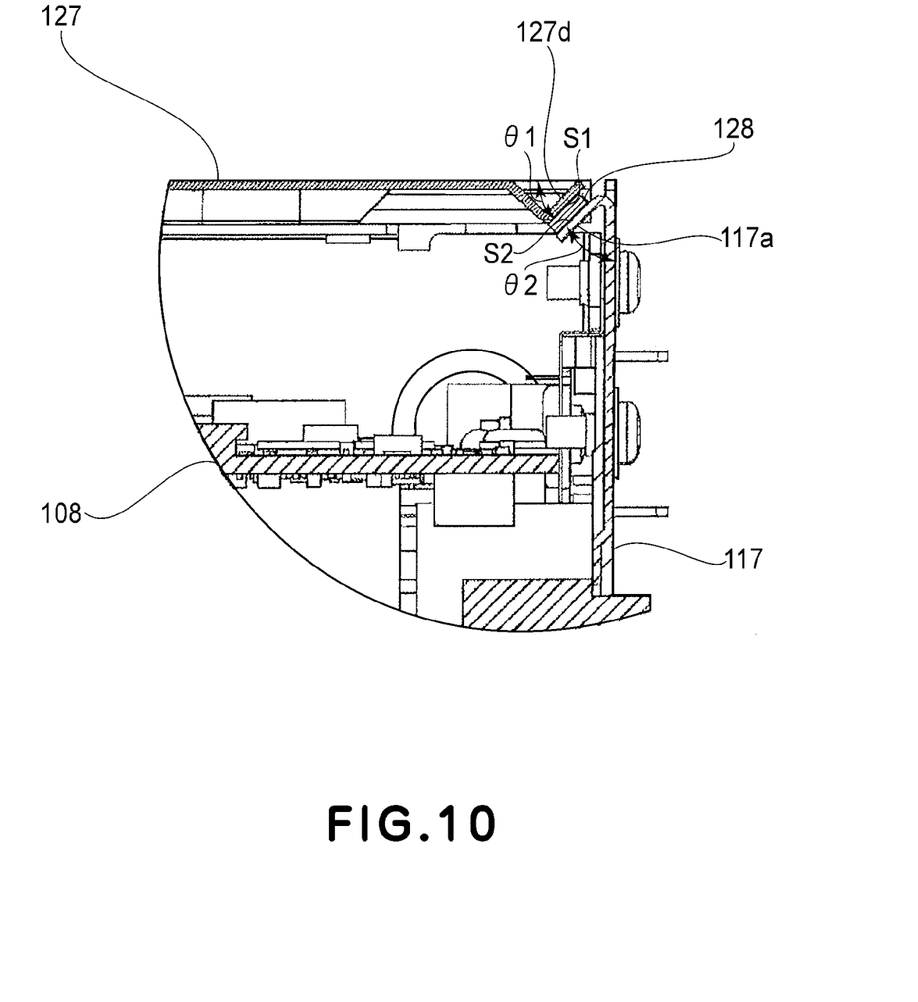
FIG. 10 is a sectional view of the device according to a second embodiment, similar to the FIG. 6.

Referring to FIG. 10, a second embodiment of the present invention will be described. In the case of this embodiment, as compared with the first embodiment, a bent portion 127d of the casing lid 127 once bent inwardly and then bent outwardly. The bent portion 127d is made parallel with a bent portion 117a of the interface supporting plate 117.

With the structure of the embodiment, the casing lid 127 can be produced through one pressing step. Therefore, the metal mold can be reduced, and therefore, the manufacturing cost can be reduced in view of the initial metal mold cost, the metal mold depreciation cost, the reduction of the machining time, the payroll, the management cost and so on.

In this embodiment, the bent portion 127d is provided by bending twice (opposite directions), the straightness of the bent portion 127d can be further improved. This is because the directions of the bending are opposite to each other, and therefore, the forces resulting from the bending offset so that the straightness is improved. As a result, the gap can be further avoided in the contact portion between the bent portion 127d and the bent portion 117a with the gasket 128 therebetween.

In this embodiment, the free end portion (edge portion) of the bent portion 127d directs outwardly, but the gasket 128 is provided inside thereof so as to be in the same potential as the interface supporting plate 117. Therefore, the production of the radiation noise can be minimized. The other structures and functions are the same as first embodiment described above.

<Third Embodiment>

Figure 11:
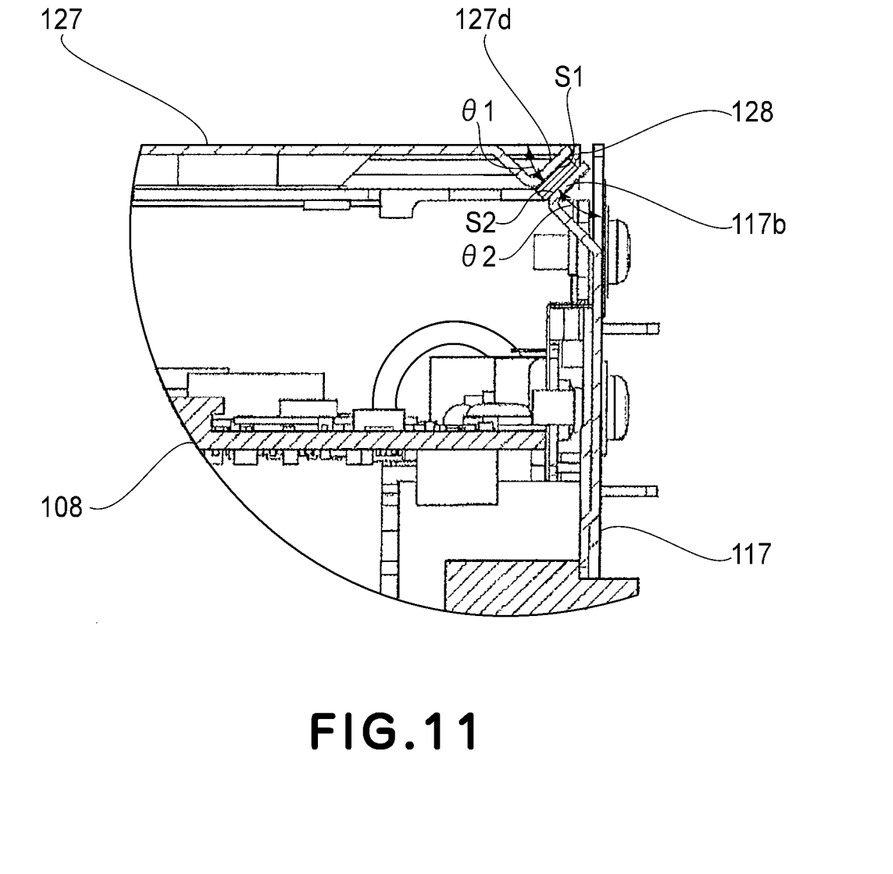
FIG. 11 is a sectional view of a third embodiment, similar to the FIG. 6.

Referring to FIG. 11 a third embodiment of the present invention will be described. In this embodiment, as compared with the second embodiment described above, a bent portion 117b of the interface supporting plate 117 is also bent once inwardly and then bent outwardly. With this embodiment, further cost reduction can be expected over the second embodiment because the metal mold of the interface supporting plate 117 can be reduced. This embodiment is effective with low cost, particularly when the production of the noise from the electric parts such as an inside child substrate B, 108 in which an inward bent projection is not preferable. The other structures and functions are the same as the second embodiment described above.

<Fourth Embodiment>

Figure 12:
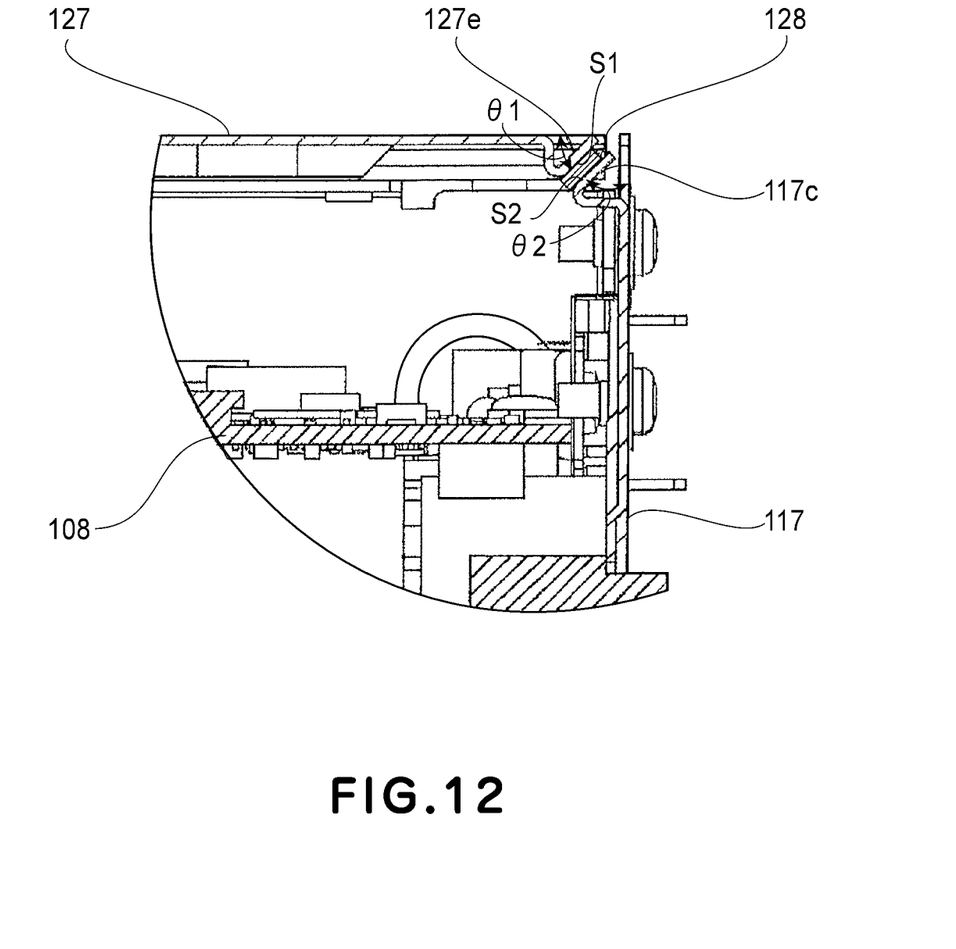
FIG. 12 is a sectional view of a fourth embodiment, similar to the FIG. 6.

Referring to FIG. 12, a fourth embodiment of the present invention will be described. In this embodiment, in order to enhance the strength of the casing 99a, the bending angle is acute, as compared with the third embodiment. First bending angles of the bent portion 117c of the interface supporting plate 117 and the bent portion 127e of the casing lid 127 are approximately 90 degrees, and then the next bending angles are approximately 45 degrees to provide the parallel relation with each other.

Similarly to the foregoing embodiments, a gasket 128 is provided between them, by which the electromagnetic radiation the inside electrical components such as the child substrate B, 108. With the structure, the rigid of the casing can be assured, and similarly to the third embodiment, the manufacturing cost is low. In addition, the space occupied by the bending can be reduced, the latitude of the lay-out in the design of the interface supporting plate 117 is enhanced. Data structures and functions are similar to those of the third embodiment described above.

<Fifth Embodiment>

Figure 13:
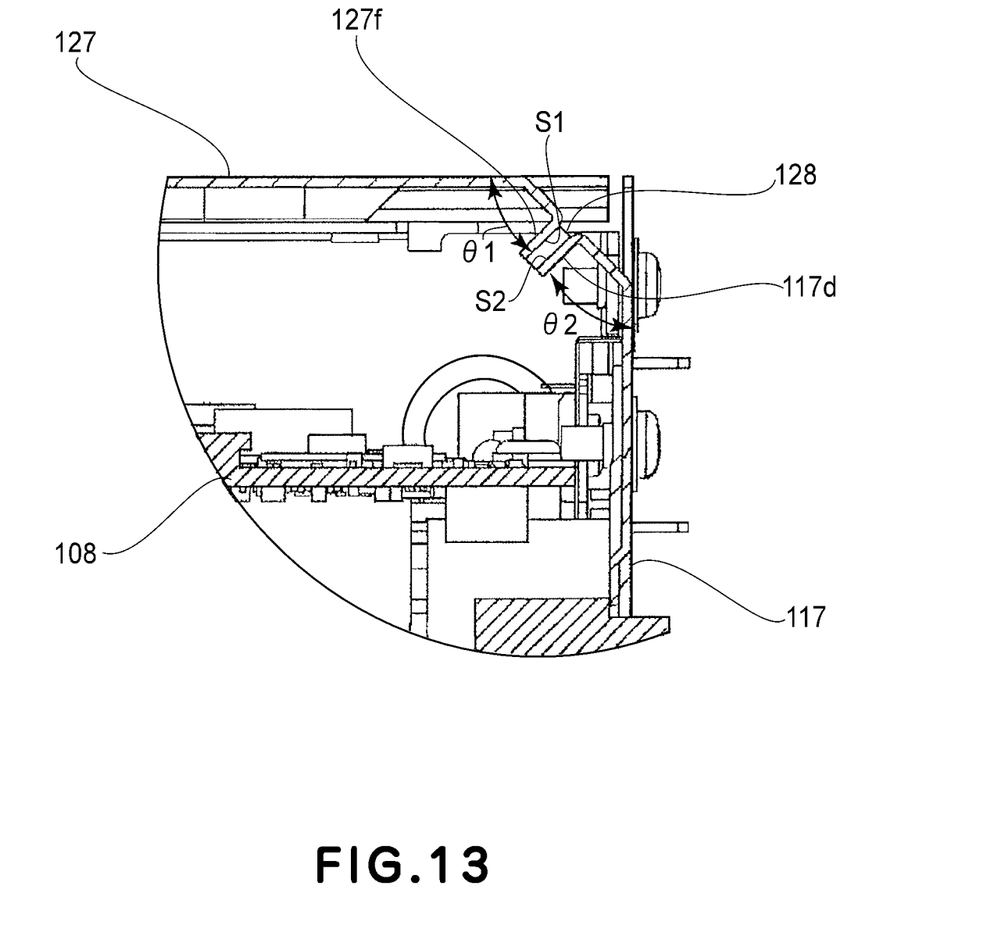
FIG. 13 is a sectional view of a fifth embodiment, similar to the FIG. 6.

Referring to FIG. 13, a fifth embodiment of the present invention will be described. In this embodiment, rigidities of the metal plate and/or the entire casing are assured while enhancing the noise prevention. A bent portion 127f of the casing lid 127 is opposed to the bent portion 117d of the interface supporting plate 117, and a gasket 128 is similarly provided. And, the electromagnetic radiation from the electrical component such as the child substrate B, 108 is prevented from leaking. The other structures and functions are the same as first embodiment described above.

While the invention has been described with reference to the structures disclosed herein, it is not confined to the details set forth and this application is intended to cover such modifications or changes as may come within the purpose of the improvements or the scope of the following claims.

This application claims priority from Japanese Patent Application No. 113266/2011 filed May 20, 2011 which is hereby incorporated by reference.

What is claimed is:

1. A casing for containing electronic equipment producing electromagnetic radiation, said casing comprising:
   a first electroconductive frame providing a first side surface of said casing, said first electroconductive frame including a first bent portion, said first bent portion being bent so that an angle formed between said first bent portion and an unbent portion of said first electroconductive frame is acute and that an edge of said first electroconductive frame is inside said casing;
   a second electroconductive frame providing a second side surface of said casing and connected with said first frame, said second electroconductive frame including a second bent portion, said second bent portion being bent so that an angle formed between said second bent portion and an unbent portion of said second electroconductive frame is acute and that an edge of said second electroconductive frame is inside said casing, wherein said second bent portion is disposed opposite to said first bent portion; and an electroconductive elastic member interposed between said first bent portion and said second bent portion such that the edge of said first electroconductive frame and the edge of said second electroconductive frame are not in direct contact with said electroconductive elastic member.

2. A casing according to claim 1, wherein said first electroconductive frame is provided with an opening which is closed by said second electroconductive frame.

3. A casing according to claim 2, wherein said first bent portion is at a side of said first electroconductive frame having the opening.

4. A casing according to claim 1, wherein said second electroconductive frame includes a supporting portion for supporting an electronic equipment.

5. A casing according to claim 4, wherein said supporting portion is inside said casing.

6. A casing according to claim 4, wherein said first bent portion and said second bent portion are disposed at a position opposed to a side of said supporting portion on which the electronic equipment is mountable.

7. An image forming apparatus comprising:

an image forming station for forming an image;

electronic equipment including a controller for said image forming station; and a casing according to claim 1 containing said electronic equipment.

* * * * *